US009587812B2

(12) United States Patent
Frederiksen

(10) Patent No.: US 9,587,812 B2
(45) Date of Patent: Mar. 7, 2017

(54) CONSTRUCTION ELEMENT WITH AT LEAST ONE ELECTRONIC COMPONENT AND ASSOCIATED METHOD

(71) Applicant: Led Ibond Holding ApS, Kongens Lyngby (DK)

(72) Inventor: Lars Frederiksen, Gentofte (DK)

(73) Assignee: LED IBOND INTERNATIONAL APS, Kgs, Lyngby (DK)

( * ) Notice: Subject to any disclaimer, the term of this patent is extended or adjusted under 35 U.S.C. 154(b) by 0 days.

(21) Appl. No.: 14/593,565

(22) Filed: Jan. 9, 2015

(65) Prior Publication Data

US 2015/0198314 A1    Jul. 16, 2015

(30) Foreign Application Priority Data

Jan. 10, 2014   (DK) ................................. 2014 70011

(51) Int. Cl.
*F21V 19/00*   (2006.01)
*F21V 23/00*   (2015.01)
(Continued)

(52) U.S. Cl.
CPC .............. *F21V 23/005* (2013.01); *F21K 9/00* (2013.01); *F21S 8/04* (2013.01); *F21V 19/003* (2013.01);
(Continued)

(58) Field of Classification Search
CPC . G02B 6/0073; F21V 19/0025; F21V 33/006; H05K 3/32; H05K 2201/10106; F21Y 2101/02
(Continued)

(56) References Cited

U.S. PATENT DOCUMENTS 6,540,373 B2 * 4/2003 Bailey ....................... E04B 9/32
362/147
2006/0198128 A1 * 9/2006 Piepgras et al. .............. 362/147

FOREIGN PATENT DOCUMENTS

CA      2 700 924 A1    4/2009
DE    199 11 860 A1   12/2000
(Continued)

OTHER PUBLICATIONS

International Search Report (Form PCT/ISA/210) issued on Mar. 18, 2015, by the European Patent Office in corresponding International Patent Application No. PCT/DK2015/050001. (3 pages).
(Continued)

*Primary Examiner* — Andrew Coughlin
*Assistant Examiner* — Meghan Ulanday
(74) *Attorney, Agent, or Firm* — Buchanan Ingersoll & Rooney P.C.

(57) ABSTRACT

The present invention relates construction element comprising: a sandwich structure comprising an electrically insulating layer and an electrically conducting front layer and an electrically conducting rear layer which are spaced apart by the electrically insulating layer. A circuit board is carrying an electronic component and is positioned between the electronic component and the electrically conducting rear layer. The electronic component comprising a first and a second electrical terminal, wherein the first electrical terminal is in electrical connection with the electrically conducting front layer, and the second electrical terminal is in electrical connection with the electrically conducting rear layer.

22 Claims, 6 Drawing Sheets

(51) Int. Cl.
  *F21V 33/00*    (2006.01)
  *F21K 99/00*    (2016.01)
  *F21S 8/04*     (2006.01)
  *H05K 3/32*     (2006.01)
  *F21W 121/00*   (2006.01)
  *H05K 1/02*     (2006.01)
  *H05K 3/00*     (2006.01)
  *F21Y 101/00*   (2016.01)

(52) U.S. Cl.
  CPC ...... *F21V 19/0015* (2013.01); *F21V 19/0025* (2013.01); *F21V 33/006* (2013.01); *H05K 3/32* (2013.01); *F21W 2121/008* (2013.01); *F21Y 2101/00* (2013.01); *F21Y 2105/10* (2016.08); *F21Y 2115/10* (2016.08); *H05K 1/0206* (2013.01); *H05K 3/0058* (2013.01); *H05K 2201/10106* (2013.01); *Y10T 29/49139* (2015.01)

(58) Field of Classification Search
  USPC ....... 362/33, 147, 153, 153.1, 253, 364, 382
  See application file for complete search history.

(56) References Cited

FOREIGN PATENT DOCUMENTS

| | | |
|---|---|---|
| EP | 1 841 013 A1 | 10/2007 |
| EP | 1 876 389 A1 | 1/2008 |
| EP | 1 933 086 A1 | 6/2008 |
| EP | 2 485 342 A2 | 8/2012 |
| WO | WO 2013/117198 A1 | 8/2013 |

OTHER PUBLICATIONS

Search Report dated Aug. 19, 2014, by the Danish Patent Office for Application No. PA 2014 70011.
Second Technical Examination mailed on Dec. 12, 2014, by the Danish Patent Office for Application No. PA 2014 70011.

* cited by examiner

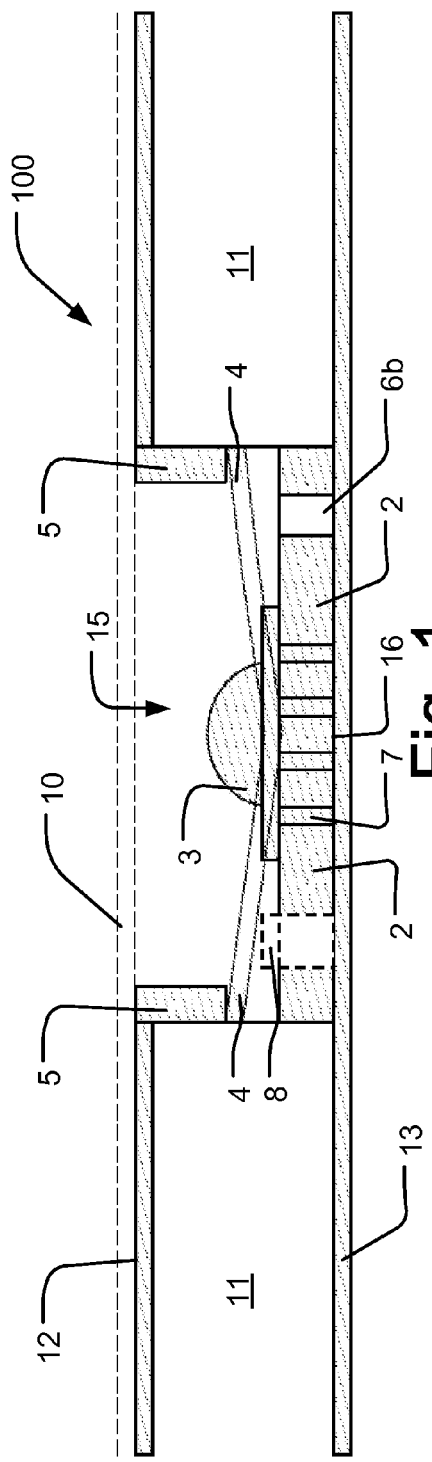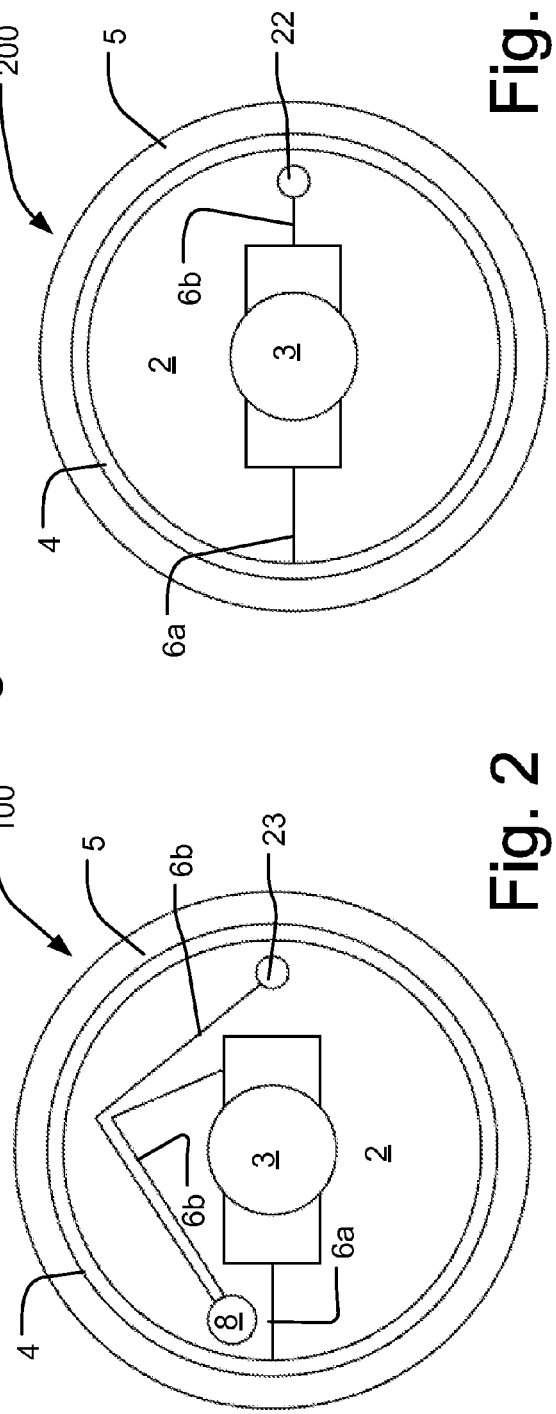

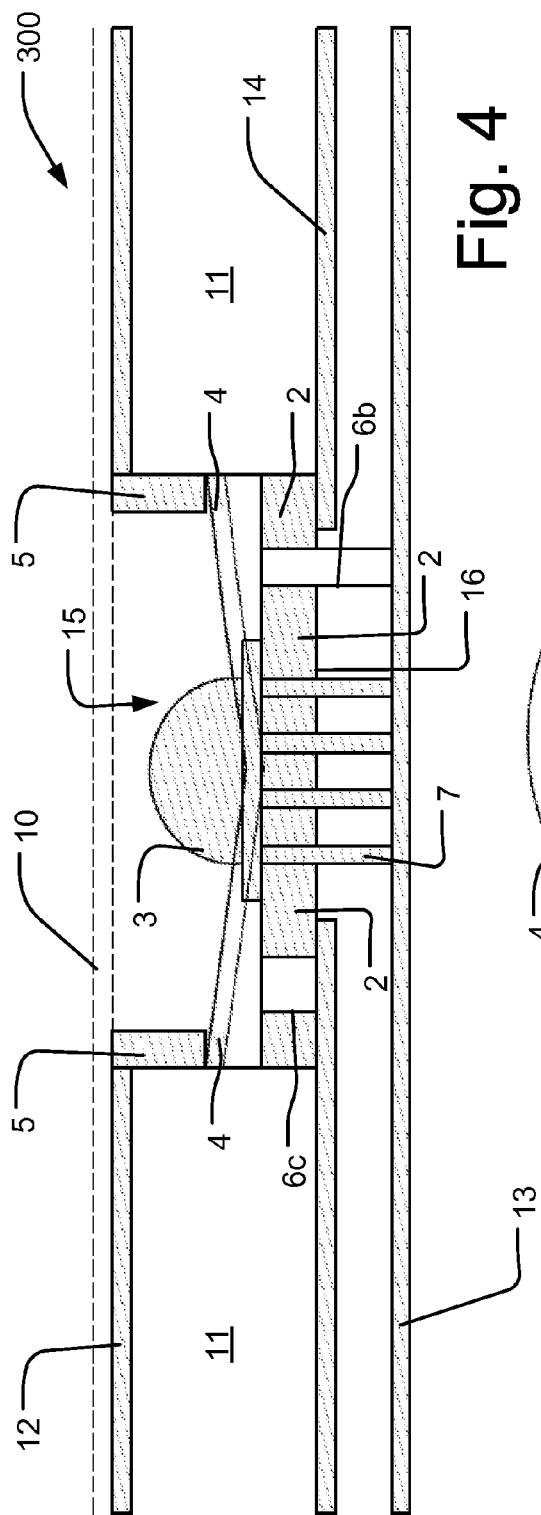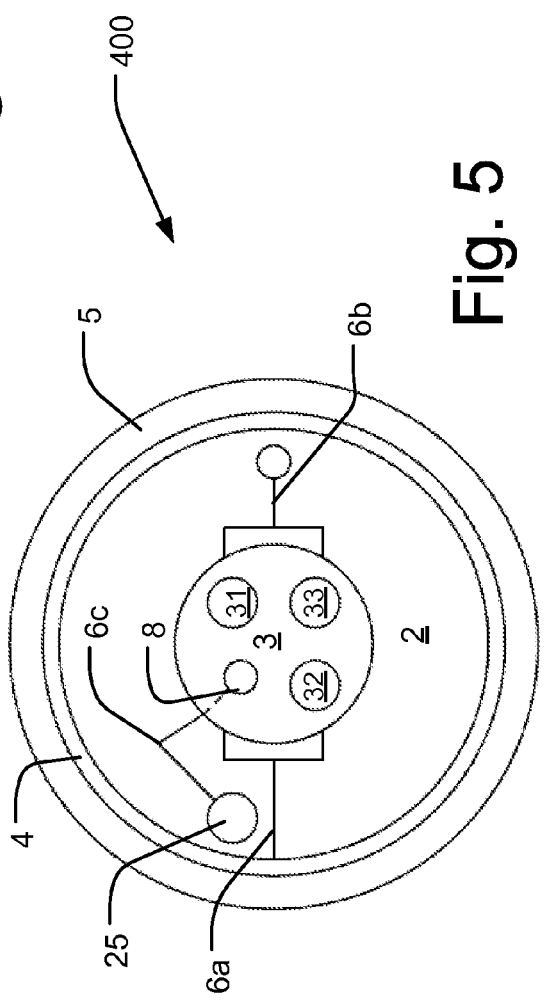

CONSTRUCTION ELEMENT WITH AT LEAST ONE ELECTRONIC COMPONENT AND ASSOCIATED METHOD

The present invention relates to a construction element e.g. for use as a ceiling panel. In particular the present invention relates to a construction element comprising: a sandwich structure comprising an electrically insulating layer and at least two electrically conducting layers, which comprises an electrically conducting front layer and an electrically conducting rear layer which are spaced apart by an electrically insulating layer. The construction element further comprises a circuit board carrying an electronic component and being positioned between the electronic component and the electrically conducting rear layer, the electronic component comprising a first and a second electrical terminal, wherein the first electrical terminal is in electrical connection with the electrically conducting front layer, and the second electrical terminal is in electrical connection with the electrically conducting rear layer. The invention further relates to an associated method.

BACKGROUND OF THE INVENTION

Attaching and electrically connecting electronic components such as light emitting diodes (LEDs) to sandwich construction panels is known in the art, and is used to create construction panels with light emitting elements.

One such example is known from EP 2 485 342 disclosing a construction panel having a sandwich structure comprising an electrically conducting front plate and an electrically conducting rear plate which are spaced apart by an electrically insulating layer, and at least one light emitter positioned in an aperture in the electrically conducting front plate.

DESCRIPTION OF THE INVENTION

It is an object of the invention to provide a simple solution to building in electronic components such as LEDs in a construction element, to a lower cost and reduced amount of cabling compared to prior art solutions.

The object is achieved with a construction element comprising a sandwich structure comprising an electrically insulating layer and at least two electrically conducting layers, which comprises an electrically conducting front layer and an electrically conducting rear layer which are spaced apart by an electrically insulating layer, a circuit board carrying an electronic component and being positioned between the electronic component and the electrically conducting rear layer, the electronic component being a light emitting diode (LED) comprising a first and a second electrical terminal, wherein the first electrical terminal is in electrical connection with the electrically conducting front layer, and the second electrical terminal is in electrical connection with the electrically conducting rear layer, which construction element comprises a controller adapted for communication of data signals via at least one of the electrically conducting layers.

The object may also be achieved with a circuit board carrying an electronic component and being positioned between the electronic component and the electrically conducting rear layer, the electronic component comprising a first and a second electrical terminal, wherein the first electrical terminal is in electrical connection with the electrically conducting front layer, and the second electrical terminal is in electrical connection with the electrically conducting rear layer.

By positioning the circuit board between the electrical component and the electrically conducting rear layer it is possible to obtain a good thermal connection to a heat sink of the electrical component.

Because the heat is effectively led away from the electronic component, the durability of the electronic component is extended and the performance over time is improved.

Furthermore the use of a circuit board allows for the use of any size or type of electronic component or LED as no individual plastic molding suitable for inserting the specific LED in the construction panel is required.

In a first aspect, the present invention relates to a construction element, the construction element comprising: a sandwich structure comprising an electrically insulating layer and at least two electrically conducting layers, wherein the sandwich structure comprises: an electrically conducting front layer and an electrically conducting rear layer which are spaced apart by an electrically insulating layer, the construction element further comprises a circuit board carrying an electronic component and being positioned between the electronic component and the electrically conducting rear layer, the electronic component comprising a first and a second electrical terminal, wherein the first electrical terminal is in electrical connection with the electrically conducting front layer, and the second electrical terminal is in electrical connection with the electrically conducting rear layer.

What is understood by "carrying the electronic component" is that the electronic component such as an LED is attached directly on the circuit board, e.g. by soldering.

The construction element may be made on two aluminum composite panels that are typically 0.3 to 0.7 mm thick aluminum sheets. The sheets may cover a core of a lower density such as a solid polyethylene mixture with a total thickness of 3 mm or more. It is also known as a Dibond® plate.

The circuit board may be any kind of board, e.g. plastic, metal etc. provided with a circuit for transmission of electricity and possibly data. The circuit may be attached to the board in different ways, e.g. by printing or soldering.

In the context of the present invention, the term "light emitting diode" or LED is to be understood as a LED comprising one or more light emitters. For example a RGB LED comprises a red, a green and a blue light emitter.

The construction element of the present invention may be adapted to be used in the construction of a building; a ship; an airplane; an elevator, a vehicle such as a car or a truck; lamps or the like.

The term "sandwich structure" is to be understood as a composite composed of a lightweight core (the electrically insulating layer) to which two or more outer layers (the electrically conducting front and rear layers) are fastened e.g. by means of an adhesive.

The term "construction element" is to be understood as an element not only for use in a construction such as a building, where it may be used as a ceiling or wall panel, but it may also be used in a lamp or lighting system.

The term "electrical terminal" is to be understood as a point or element for entry of power and/or data.

In the present invention, the terms "electrically conducting front layer" and "electrically conducting rear layer" shall not be seen as limiting. Accordingly, the electrically conducting rear layer may be used as a front layer and vice versa.

Examples of electronic components are LEDs, transistors, controllers, chip on boards (COB), drivers, power supplies, microphones, cameras, sensors or fans. Different electronic components may be combined in one construction element.

In case more electronic components are present, the circuit boards are preferably positioned under each of the electronic components. Thus each electronic component is connected or associated with its own circuit board. The electronic components are preferably not mounted on one common circuit board. By associating each electronic component with its own circuit board and leading the power through the electrically conducting layers a low voltage drop is obtained. If all electronic components were positioned on the same circuit board the cross section of the power supply lines would be much smaller and result in a greater voltage drop. Here the electrically conducting front and rear layers are forming part of the power supply lines. The electrically conducting front and rear layers generally have a greater cross sectional area than power supply lines on a circuit board.

Each circuit board is preferably 10-20 mm in diameter.

The circuit board is preferably positioned in a recess together with the electronic component.

The construction element may comprise a controller adapted for communication of data signals via at least one of the electrically conducting layers.

By transmitting data signals via at least one of the electrically conducting layers, it is not necessary to have a large circuit board, where the electronic components are attached to in order to facilitate the data communication. Instead a much cheaper electrically conducting layer such as an aluminum plate may be used. This is particularly advantageous over large distances or a greater area such as a ceiling or a tunnel.

The controller may also be positioned outside the construction element or each electronic component may be provided with its own controller, preferably positioned in the vicinity of the electronic component.

The data is not necessarily transmitted via the electrically conducting front layer and/or the electrically conducting rear layer, but may be transmitted via a third layer positioned preferably between the electrically conducting front layer and the electrically conducting rear layer, but may also be positioned on either side of the respective layers.

The density of the core may be lower or higher than the density of the outer layers. The core may be thicker or thinner than each or both of the outer layers. The core may be thinner than each or both of the outer layers.

The construction element may comprise two or more electronic components (e.g. LEDs).

The electrically conducting front and rear layers may be made from the same materials or of different electrically conducting materials. The electrically conducting materials may be one or more of titanium, aluminum, cobber, steel, stainless steel, silver, gold, graphite, brass, silicon and conducting polymer or a composite material. These materials may also be used for further elements of the invention such as the retainer element or the electrically conducting element as described below.

The thickness of each of the electrically conducting layers may be up to 50 millimeters, such as up to 40 millimeters, such as up to 30 millimeters, such as up to 20 millimeters, such as up to 10 millimeters, such as up to 5 millimeters, such as up to 1 millimeter, such as 0.1-50 millimeters, such as 0.4 to 1 millimeters.

The electrically conducting front and/or rear layer may be divided into one or more separate zones such that different electrical potentials may be defined.

The electrically insulating material may comprise a foamed material (open and/or closed celled) and/or a reinforced material such as a fiber glass material. The electrically insulating layer may be made of a polymer material such as amorphous plastic materials (e.g. polyvinylchloride, polycarbonate and polystyrene) or crystalline plastic materials (e.g. Nylon, polyethylene and polypropylene), or wood.

The electrically insulating material may define a honeycomb structure.

The construction element may be a construction panel. A construction panel is a construction element that may be used as a ceiling and/or a wall and/or a floor and/or a shelf and/or a top and/or other part of a construction. The construction panel may be used as an outer surface of the building or an inner surface of a room or space, such as an elevator.

As an example, the construction panel may be used as a ceiling panel in a building. Such a ceiling panel may be a panel which is attached or secured to a grid-like structure suspended from the ceiling. Alternatively, the ceiling may form a larger surface. The ceiling panel may be directly fastened to a surface such as a ceiling or a wall.

In an embodiment the data signals are transmitted via the electrically conducting front layer and/or the electrically conducting rear layer by means of Direct Current Power Line Communication (DC PLC). Thus there is no separate layer for data communication, but instead the data is transmitted on the same layer as the power to the electrical component. This dispenses with the need for separate wiring for data transfer.

The construction element may further comprise a third electrically conducting layer, preferably positioned between the electrically conducting front layer and the electrically conducting rear layer, where the third conducting layer is adapted to transmit the data signals. By adding a third layer the data transfer is separated from the power transfer. Thereby any glitch or noise over the power line does not disturb the data transfer. Additionally more layers may be added to the structure such that the electrically conducting front or rear layer are not necessarily the outermost layers. Further layers may also be added between the electrically conducting front or rear layer.

The electronic component may be a light emitting diode, LED, preferably a Surface Mount Diode, SMD and/or a Red, Green, Blue, RGB, light emitting diode. The construction element is particularly suitable for SMD's although other electronic components may be used in this construction element as well.

The controller may be adapted to control one or more of color of emitted light, color combination of emitted light from two or more light emitters, invisible light frequencies and/or light intensity. For example it may be able to dim the light change and/or the color combination of and RGB diode. It may also be able to read output from a sensor and in turn control the electronic component based on the output.

The construction element may comprise at least a first and a second electronic component, the first electronic component being connected to a first controller and the second electronic component being connected to a second controller, wherein the first controller is adapted to receive data from the second controller and the second controller is adapted to send data to the first controller. Consequently the controller associated with a first electronic component may be able to control the output of a second electronic component. Each of the electronic components may be assigned a name such that the controller associated with the individual electronic component is able to communicate and send instructions to other controllers and/or electronic components. Additionally the electronic components in a construction element may be part of a network such that electronic components of one or more construction elements may be controlled by a central controller. If it is not required to control the individual electronic components in a construction element but only to control the electronic components the same way, only one controller may be used for the whole construction element.

The construction element may further comprise a light processing layer on top of the electrically conducting front layer or only covering a recess provided in the sandwich structure in which the electronic component is provided. The light processing layer is preferably a polymer panel or film, such as an opallized acrylic panel/film, a clear acrylic panel/film, an acrylic prismatic panel/film, a transparent or semitransparent colored panel/film, a lens and/or an acrylic lens panel. The panel or film is used for protecting the electronic component e.g. from water and/or scatter and/or diffuse and/or focus light emitted from the electronic component or LED. This is advantageous for example when the construction element is an outdoor lamp or lighting system or the construction element is a ceiling panel where a particular kind of light is desired for different applications such as lighting for office work, hall way lighting, operating room lighting etc.

The light processing layer, in particular a panel covering all electronic components in a construction element, secures that no dust is allowed to enter into the electronic components and additionally secures that no potentially loose parts fall down. This is particularly advantageous in the food processing industry.

The electrically conducting front layer may also be covered by a wooden surface, which allows for the LED to extend through the wooden material. Alternatively, the wooden material may define transparent or semitransparent areas arranged to allow the light emitted by the light emitter to be emitted there through.

The electronic component may be positioned in a recess in the construction element, making it possible to attach an additional layer e.g. with glue to the electrically conducting front layer. This is also a way of making the construction element watertight.

The construction element may further comprise: a conducting retainer element positioned at least partly inside the recess along the circumference of the recess in contact with the electrically conducting front layer, and/or a conducting element, preferably resilient, such as a wave spring or spring washer, positioned, preferably in press, between the conducting retainer element and the circuit board such that an electrical connection is established between the electrically conducting front layer and the circuit board. These two elements thus have several functions. Namely to lead the power and/or data to the electronic component from the electrically conducting front layer, to make sure that the circuit board is kept in place, and to compensate for thermal stress during operation of the construction element and/or electronic component. Alternatively the circuit board may be kept in place by other attachment means such as glue and the power may be supplied via different power supplying means.

The cross sectional diameter of the recess accommodating the electronic component is preferably in the interval of 1-20 cm, more preferably 1-3 cm, most preferably in the interval of 1-2 cm.

The controller may be positioned in the recess for example on the circuit board. In case of a RGB diode, where it may be relevant to control the individual light emitters, the controller is positioned inside the case or lens that surrounds the light emitters. Were several electronic components in a construction element are to be controlled centrally, the controller may be positioned in its own recess somewhere in the construction panel.

The electronic component or the controller are not necessarily positioned in a recess, but may be protruding from the construction element.

The electrically conducting front layer may function as a cathode and the electrically conducting rear layer may function as an anode or vice versa.

The conducting element may be provided with one or more conducting legs providing a connection between a base of the conducting element and the conducting retainer element. The conducting legs are preferably resilient and are preferably positioned in press between the retainer element and the circuit board. The conducting element may be made of spring steel or another metal.

The one or more conducting legs may have a proximal end facing the conducting element and a distal end facing the conducting retainer element, wherein the interface between the distal end and the conducting retainer element may provided with a nickel or silver coating. The nickel or silver coating contributes to a good electrical contact, in particularly over a longer period of time. The nickel or silver coating may be provided on the distal end of the legs or on the retainer element or both.

The circuit board may be made of metal, preferably aluminum or an aluminum alloy. This allows for a particularly good heat transfer from the heat sink of the electronic component.

The electronic component may be turned 180 degrees in a plane parallel to any of the conducting front or rear layers. In this way a cathode and anode, also known as the first and the second electrical terminal on the electronic component may be switched around.

In another embodiment the circuit board has a front side which faces the electronic component and a back side which faces the electrically conducting rear layer, wherein at least a part of the back side may be provided with a gold or silver coating. This provides a good electrical connection to the electrically conducting rear layer. The gold or silver coating may alternatively be provided on the electrically conducting rear layer.

The circuit board may be a printed circuit board. A circuit may thus be printed on the board.

In a further embodiment a pre-resistor is connected in series with the electronic component.

The pre-resistor may positioned between the electronic component and one of the electrically conducting front layer and the electrically conducting rear layer.

The pre-resistor, which preferably is variable, makes it possible even at low current intensities and thereby low power output of the LED or electrical component to even out differences in voltage drop or resistance between several electrical components or LEDs connected in parallel in the construction element or dibond plate. Thereby the pre-resistor may contribute to creating an even light output of several LEDs when the light is dimmed to for example 30% of the normal or maximum light output.

At a normal light output or at a higher effect the pre-resistor is less important and should be as small as possible in order to avoid loss of effect at normal operation, i.e. when the light is not dimmed. The pre-resistor may be soldered to the circuit board, but it may also be positioned elsewhere or attached in a different way.

The pre-resistor may also be positioned between one of the electrically conducting front layer and the electrically conducting rear layer and the controller, depending on the configuration.

The retainer element may be made of aluminum or aluminum alloy or comprise a combination of polymer and spring steel. Preferably the retainer element has thermal and electrical characteristics similar to the thermal and electrical characteristics of aluminum.

In a further embodiment an outer side of the retainer element adapted for engagement with the electrically insulating layer is corrugated. The retainer element may be fluted or have a one or more ridges extending along the outer circumference of the retainer element. This allows for a tight fit with the electrically insulating layer.

The retainer element and the electrically conducting element may be used for data transfer like the electrically conducting layers. The electronic component may be adapted to be turned 180 degrees in a plane parallel to any of the conducting front or rear layers. Thereby the anode and cathode or electrical terminals, are able to be switched around.

According to a second aspect a method of transmitting data to an electronic component comprised by a construction element comprises the steps of: providing a sandwich structure comprising an electrically insulating layer and at least two electrically conducting layers, the sandwich structure comprising an electrically conducting front layer and an electrically conducting rear layer which are spaced apart by an electrically insulating layer, providing a circuit board between an electronic component and the electrically conducting rear layer, positioning the electronic component on the circuit board, providing the electronic component with a first and a second electrical terminal, connecting the first electrical terminal with the electrically conducting front layer and connecting the second electrical terminal with the electrically conducting rear layer.

In an embodiment the method comprises the steps of:
providing a sandwich structure comprising an electrically insulating layer and at least two electrically conducting layers, which comprises an electrically conducting front layer and an electrically conducting rear layer which are spaced apart by an electrically insulating layer,
providing a circuit board between an electronic component being a LED and the electrically conducting rear layer,
positioning the electronic component on the circuit board,
providing the electronic component with a first and a second electrical terminal,
connecting the first electrical terminal with the electrically conducting front layer,
connecting the second electrical terminal with the electrically conducting rear layer, and
providing a controller, and communicating data signals to and/or from the controller via at least one of the electrically conducting layers.

In an embodiment the method may further comprise providing a controller, and communicating data signals to and/or from the controller via at least one of the electrically conducting layers.

In the following, the invention will be described in further detail with reference to the drawings in which:

FIG. 1 is a cross sectional view of a first embodiment of the invention,

FIG. 2 is a view of the first embodiment of the invention, as seen from above,

FIG. 3 is a view of the second embodiment of the invention, as seen from above,

FIG. 4 is a cross sectional view of a third embodiment of the invention,

FIG. 5 is a view of the fourth embodiment of the invention, as seen from above,

Figure 6:
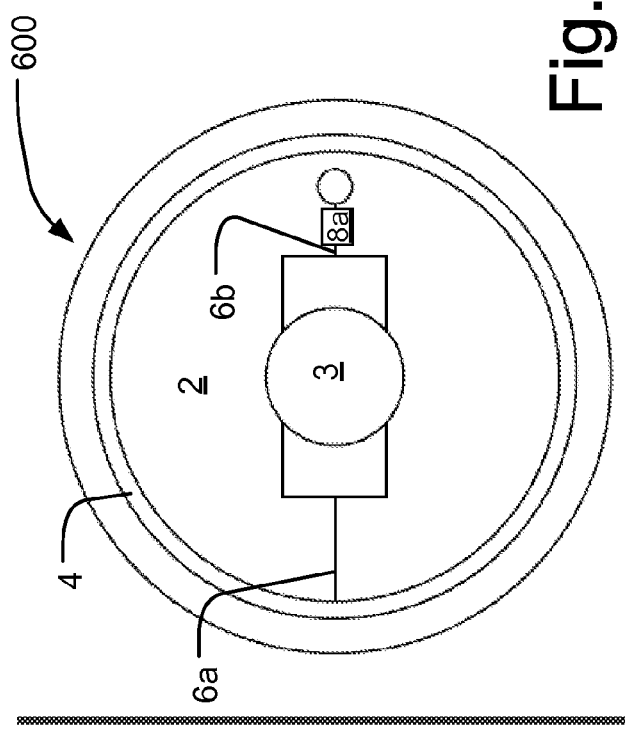
Figure 7:
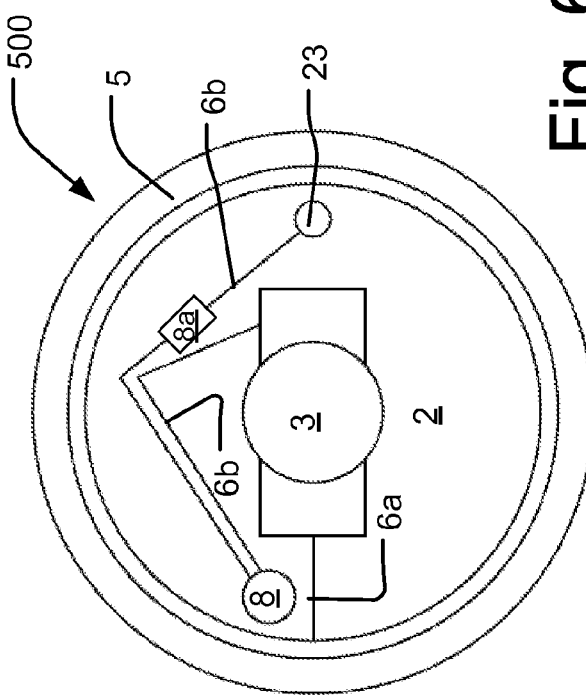
Figure 8:
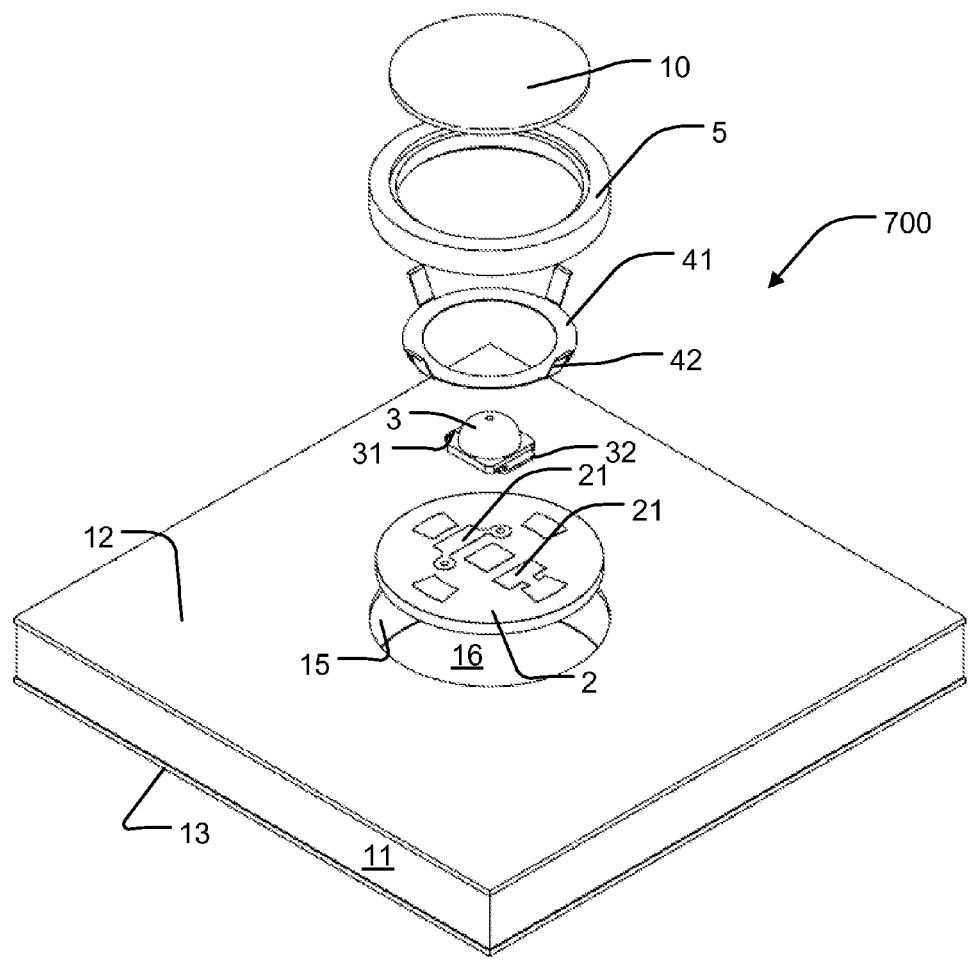
Figure 9:
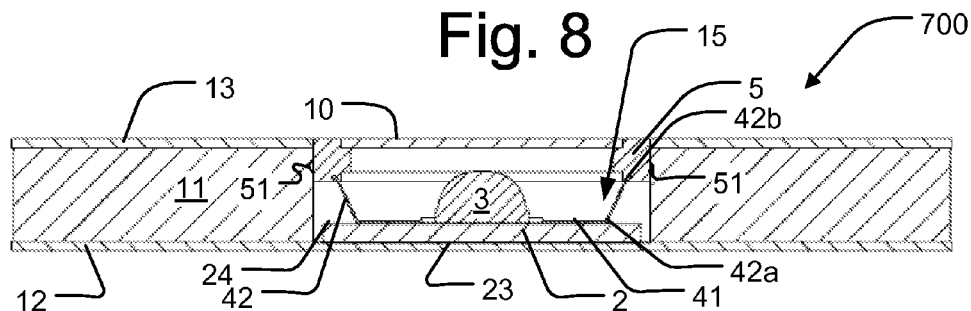
Figure 10:
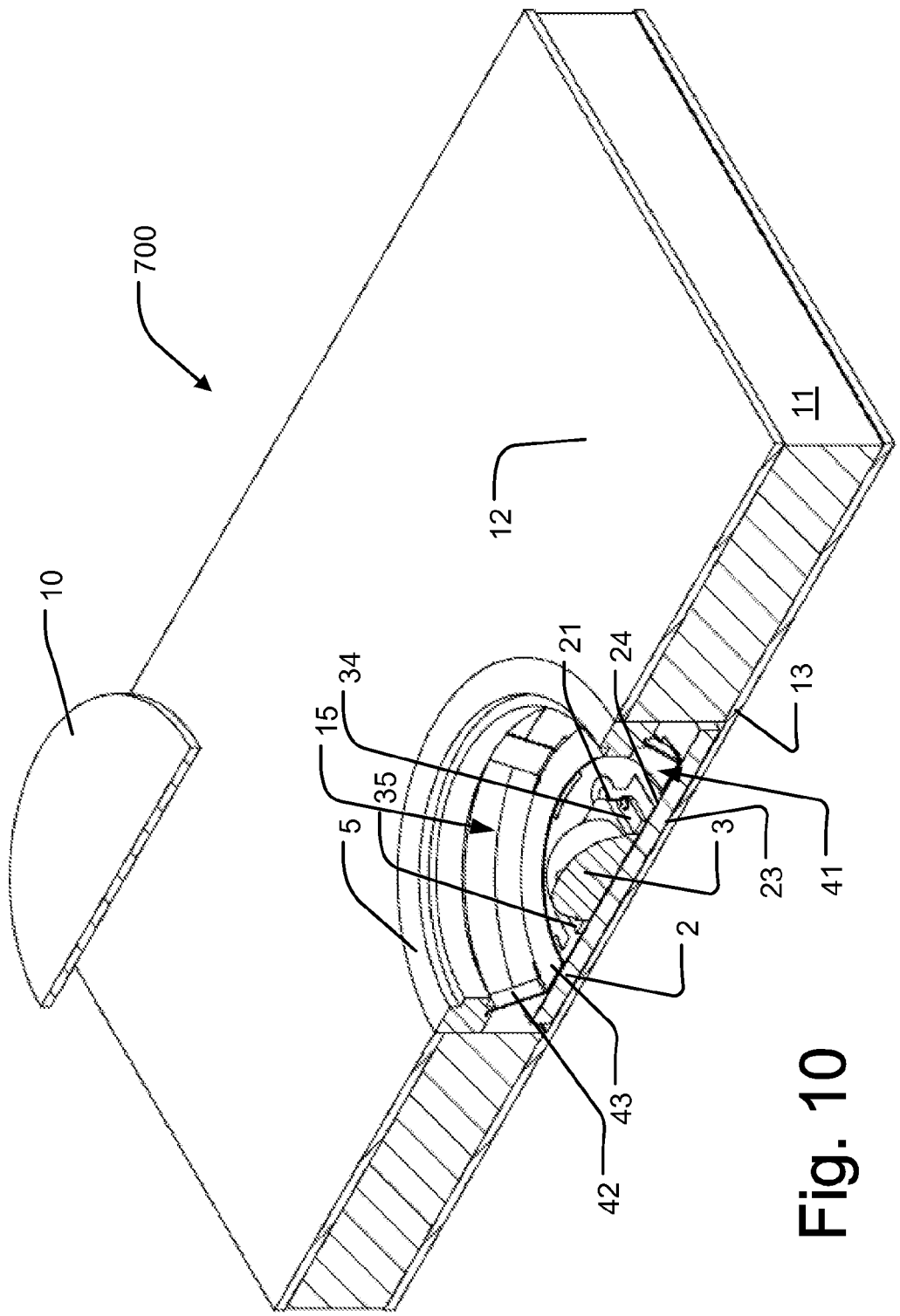
Figure 11:
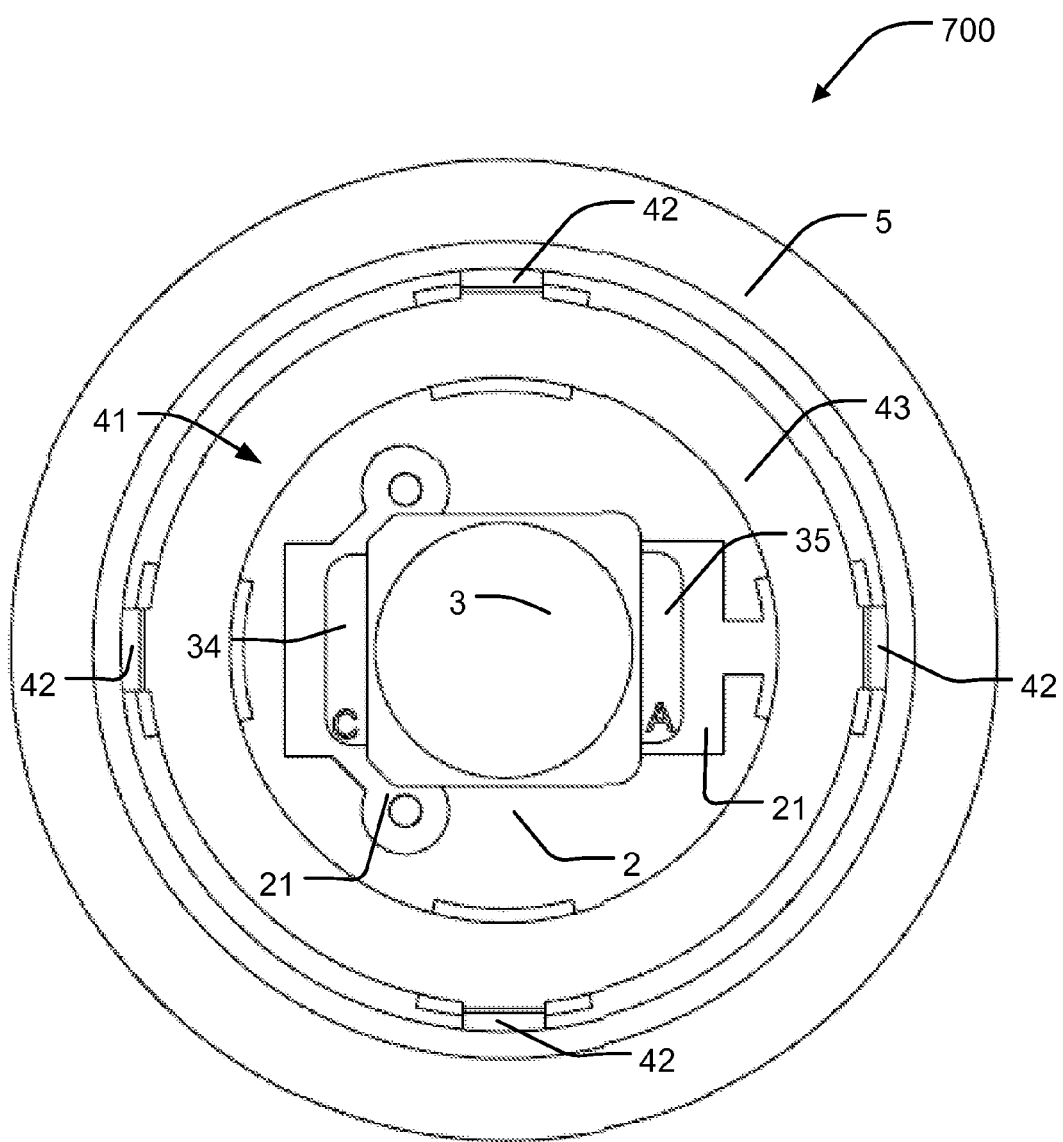

FIG. 6 is a view of the fifth embodiment of the invention where a pre-resistor is positioned between the controller and the electrically conducting rear layer, which contributes to providing the power to the electronic component or LED and the controller, FIG. 7 a view of the sixth embodiment of the invention where a pre-resistor is positioned between the electronic component or LED and the electrically conducting rear layer, FIGS. 8-11 show different views of a seventh embodiment, FIG. 8 is an exploded view of the seventh embodiment, FIG. 9 is a cross-sectional view of the seventh embodiment, FIG. 10 is a perspective cross-sectional view of the seventh embodiment, And FIG. 11 is a view from above of the seventh embodiment.

FIGS. 1 and 2 shows a part of a construction element 100 comprising a sandwich structure. The construction element could be for example a construction panel, such as a ceiling panel. The sandwich structure is in this embodiment comprising an electrically insulating layer 11 e.g. polyethylene positioned between an electrically conducting front layer 12 and an electrically conducting rear layer 13. The electrically conducting front layer 12 and the electrically conducting rear layer 13 are made of e.g. aluminum, but may be made electrically conducting by the use of other conducting materials. The sandwich structure is provided with a recess 15, in this case a cylindrical recess, through the electrically conducting front layer 12 and the electrically insulating layer 11. The recess 15 comprises a bottom 16 constituted by the electrically conducting rear layer 13 and wall(s) constituted by the electrically insulating layer 11 and the electrically conducting front layer 12. The recess 15 may be other shapes such as box shaped or triangular. Inside the recess 15 a printed circuit board (PCB) 2 is provided. The PCB 2 is the same shape and size, or slightly smaller size, as the bottom of the recess 15. It may also be even smaller, larger or a different shape. A surface mount diode (SMD) 3 alternatively another kind of LED is attached to the PCB 2. The SMD 3 comprises a first and a second electrical terminal (not shown), functioning as the cathode and anode, respectively.

The first electrical terminal is in a first electrical connection 6a with the electrically conducting front layer 12, and the second electrical terminal is in second electrical connection 6b with the electrically conducting rear layer 13.

The first electrical connection 6a to the electrically conducting front layer 12 is formed from the first electrical terminal via a, preferably printed, conductor 6a on the PCB 2 extending to a supply circuit in the form of a cobber ring at the circumference of the PCB 2. The supply circuit is in contact with a resilient electrically conducting element in the form of a wave spring 4 positioned along the circumference of the recess 15. Thus the contact between the SMD 3 and the PCB 2 is established through the wave spring 4. The spring is preferably made of a suitable metal e.g. spring metal or an aluminum alloy. The wave spring is in press between the PCB 2 and an electrically conducting retainer element in the form of an electrically conducting retainer ring 5, extending along the circumference of the recess and between the electrically conducting front layer 12 and the wave spring 4. The wave spring 4 is waved along the edge such that the edge of the wave spring 4 alternately is in contact with the electrically conducting element 5 and the PCB 2. The electrically conducting retainer ring 5 thus establishes an electrical contact to the electrically conducting front layer 12. The wave spring 4 and the electrically conducting retainer ring 5 thus keep the PCB 2 in place.

Alternatively the wave spring may be dispensed with such that the electrically conducting retainer ring 5 is in direct contact with the supply circuit on the PCB 2. As a further alternative the electrically conducting front layer 12 may extend over the electrically conducting retainer ring 5 such that the electrically conducting front layer 12 keeps the electrically conducting retainer ring 5 in place.

Instead of using a wave spring, a spring washer, a disc spring or a coil spring may be used.

The second electrical connection 6b to the electrically conducting rear layer 13 is formed from the second electrical terminal via a, preferably printed, conductor on the PCB 2 extending to a controller 8 mounted on the PCB 2. From the controller 8 a conductor extends a hole 23 in the PCB 2. From the circumference of the hole 23 a electrically conducting pipe extends to the electrically conducting rear layer 13. Instead of an electrically conducting pipe other means of forming an electrical connection may be used, such as a cable or a rod. Power to the SMD 3 is thus supplied via the controller 8.

In case more LEDs or SMDs are present, preferably positioned in each their recess 15, they may each be provided with a controller. Alternatively, the controller positioned in the recess may control several LEDS or SMDs in the same construction element or in several construction elements that for example form a suspended ceiling. The controller may in turn be connected to a network or computer, from which it may receive instructions.

The construction element 100 is furthermore provided with a heat sink in the form of cobber threads 7 extending between the SMD 3 and the electrically conducting rear layer 13 through the PCB 2. Other heat conducting materials may be used as well.

Additionally as all the components/elements in the recess may be flush with the surface of the electrically conducting front layer 12, i.e. there are no protruding parts extending beyond the surface of electrically conducting front layer 12, an additional light processing layer 10 in the form of an acrylic plate is provided on top of the electrically conducting front layer 12. The light processing layer 10 may only cover the recess, for example if it is in the form of a recessed lens, or it may also be dispensed with. The light processing layer may be used for protecting the electronic component from water and/or Ultra Violet (UV) light and/or scatter and/or diffuse and/or focus light emitted from the light emitting diode.

Further attachment means may be used to keep the individual elements in place, such as an adhesive or paste that may be electrically conducting. Also an optical lens may be attached as the light processing layer 10 or be incorporated therein.

FIG. 3 shows a second embodiment. What differs from the features mentioned under FIGS. 1 and 2 is that a controller is mounted separately from the individual SMD 3 but still forms a part of the construction element. The controller may e.g. be connected to the construction element via a cable being connected to the front and/or rear electrically conducting layers or be mounted in a recess.

Instead of the electrical connection 6b runs via the controller, the SMD 3 is connected directly to the electrically conducting rear layer 13 via the conductor printed on the circuit board to a hole 22 from which a pipe extends to the electrically conducting rear layer 13 as shown in FIG. 1.

As more SMDs or LEDS may be mounted in the construction element, only one controller is required control all of them. The controller is able to control features of the SMD or electrical component such as color of emitted light, color combination of emitted light from two or more light emitting diodes, invisible light frequencies and/or light intensity. The controller may transmit data via one or more of the electrically conducting layers 12, 13 through direct current power line communication (DC PLC) or via a third layer as shown in FIG. 4.

FIG. 4 shows a third embodiment of a part of a construction element 300. What differs from the above embodiments is that a data transmission layer 14 has been positioned between the electrically conducting front layer 12 and electrically conducting rear layer 13. Here the data is not transmitted via the electrically conducting front layer 12 and/or the electrically conducting rear layer 13, but is instead separated from the power supply.

Thus an electrical connection 6b is established to the electrically conducting rear layer 13 through a hole in the data transmission layer 14. A data connection 6c is established to the data transmission layer 14 from the PCB 2.

The heat sink 7 extends through a hole in the data transmission layer 14 to the electrically conducting rear layer 13 as well.

FIG. 5. shows a fourth embodiment 400 of the recess 15 as seen from above. It may be combined with the embodiments 100, 200 and/or 300 and contains several of the same features as explained under the previous embodiments. The LED in this embodiment comprises a Red light emitter 31, a Green light emitter 32 and a Blue light emitter 33, and a controller 8 inside the LED. This means that the controller 8 may be used to mix light emitted from the three light emitters 31, 32, 33. The controller makes is possible to control/change/mix the color of the light, dim the light etc. The controller 8 inside the diode is in turn connected to a controller or computer positioned elsewhere, e.g. in the construction element. The controller 8 is connected to a data connection point 25 on the PCB via data connection 6c.

In FIG. 6 a fifth embodiment 500 according to the invention is shown. What differs from the embodiment in FIG. 2 is that a pre-resistor 8a is positioned between the controller 8 and the electrically conducting rear layer (not shown), which forms part of the power supply to the electronic component 3 and the controller 8 and which may be used for data transfer as well. Remaining features correspond to those on FIG. 2. The pre-resistor 8a may also me positioned between the controller 8 and the electrically conducting front layer depending on the configuration. The pre-resistor 8a, which preferably is variable, makes it possible even at low current intensities and thereby low power output of the LED or electrical component to even out differences in voltage drop or resistance between several electrical components or LEDs parallel connected in the construction element or dibond plate. Thereby the pre-resistor 8a may be contributing to creating an even light output of several LEDs when the light is dimmed. The pre-resistor 8a is soldered to the PCB, but may be positioned elsewhere or attached in a different way.

In FIG. 7 a sixth embodiment 600 according to the invention is shown. What differs from the embodiment in FIG. 3 is that a pre-resistor 8a is positioned between the electronic component 3 and the electrically conducting rear layer (not shown), which forms part of the power supply to the electronic component 3. Remaining features correspond to those on FIG. 3.

Instead of the controller being positioned in connection with the individual electronic component, as disclosed in FIG. 6, the controller may be positioned somewhere in the construction element or elsewhere and controlling several electronic components at once. The pre-resistor 8a, which preferably is variable, makes it possible even at low current intensities and thereby low power output of the LED or electrical component to even out differences in voltage drop or resistance between several electronic components or LEDs connected in parallel in the construction element or dibond plate. Thereby the pre-resistor 8a may be contributing to creating an even light output of several LEDs when the light is dimmed. In the case were the controller 8 is positioned separately from the electronic component, data may be sent from the controller to the electronic component via the electrically conducting front or rear layer by means of Direct Current Power Line Communication.

In FIGS. 8-11 a seventh embodiment 700 is shown. What differs from the previous embodiments is that the conducting element 41 is slightly different and further features are disclosed. Any features from this embodiment may be combined with the embodiments in FIGS. 1-7.

It shows a part of a construction element 100 comprising a sandwich structure. The construction element could be for example a construction panel, such as a ceiling panel. The sandwich structure is in this embodiment comprising an electrically insulating layer 11 e.g. polyethylene positioned between an electrically conducting front layer 12 and an electrically conducting rear layer 13. The electrically conducting front layer 12 and the electrically conducting rear layer 13 are made of e.g. aluminum, but may be made electrically conducting by the use of other conducting materials. The sandwich structure is provided with a recess 15, in this case a cylindrical recess, through the electrically conducting front layer 12 and the electrically insulating layer 11. The recess 15 comprises a bottom 16 constituted by the electrically conducting rear layer 13 and wall(s) constituted by the electrically insulating layer 11 and the electrically conducting front layer 12. The recess 15 may be other shapes such as box shaped or triangular. Inside the recess 15 a printed circuit board (PCB) 2 is provided. The PCB has front side 24 and a back side 23. The PCB 2 is the same shape and size as the bottom of the recess 15. It may also be smaller or a different shape. An LED 3 is attached to the PCB 2. The LED 3 comprises a first 34 and a second 35 electrical terminal, functioning as the cathode and anode, respectively.

The first electrical terminal 34 is adapted to be in electrical connection with the electrically conducting front layer 12, and the second electrical terminal 35 is in second electrical connection with the electrically conducting rear layer 13. The LED 3 may be turned 180 degrees in a plane parallel to the electrically conducting layers such that the terminals are positioned oppositely.

The PCB 2 is an aluminum plate provided with a printed circuit 21. The aluminum secures a good thermal and electrical contact to the electrical component's heat sink (not shown). The PCB 2 is coated on the back side 23 with a thin layer of gold to provide at good thermal and electrical contact to the bottom of the recess in the form of the electrically conducting rear layer 13. The gold coating may be dispensed with.

The contact between the PCB 2 and the electrically conducting front layer 12 is provided by means of an electrically conducting element 41 encircling the LED 3. The electrically conducting element 41 is provided with four conducting resilient legs 42 extending between a base 43 of the electrically conducting element 41 and an electrically conducting retainer element 5. Alternatively, the electrically conducting element 41 may be provided with an arbitrary number of legs such as three to six legs. The conducting legs 42 have a proximal end 42a facing the conducting element and a distal end 42b facing the conducting retainer element 5, wherein the interface between the distal end 42b and conducting retainer element 5, preferably the distal end 42b, is provided with a nickel coating.

The electrically conducting element 41 is made of spring steel. The nickel coating provides a good electrical contact. The nickel coating may be dispensed with and the electrically conducting element 41 may be made of other conducting materials or at least comprise a conducting material. The nickel coating may alternatively or additionally be provided on the points of contact on the PCB 2 and/or on the retainer element 5.

The retainer element 5 may be provided with a ridge 51 (as seen on FIG. 9), adapted for engagement with the slightly resilient insulating layer 11. The retainer element 5 may also be fluted or corrugated. The retainer element 5 is made of aluminum but may also be made of other materials such as a mixture of polymer and spring steel, preferably with similar thermal and electrical properties to aluminum.

The light processing layer 10 in FIGS. 8-11 is a recessed lens covering the recess, such that the light processing layer is flush with the electrically conducting front layer 12.

Like numbers are used for the same features throughout the application.

In general, the features of the embodiments shown and described may be combined freely and no feature should be seen as essential unless stated in the claims.

The invention may be also be considered as having the following patent element:

A. A construction element comprising:
a sandwich structure comprising an electrically insulating layer and at least two electrically conducting layers, the sandwich structure comprising an electrically conducting front layer and an electrically conducting rear layer which are spaced apart by an electrically insulating layer,
a circuit board carrying an electronic component and being positioned between the electronic component and the electrically conducting rear layer,
the electronic component comprising a first and a second electrical terminal, wherein the first electrical terminal is in electrical connection with the electrically conducting front layer, and the second electrical terminal is in electrical connection with the electrically conducting rear layer.

B. The construction element according to element A, wherein the construction element comprises a controller adapted for communication of data signals via at least one of the electrically conducting layers.

C. The construction element according to element A or B, wherein the construction element is a construction panel.

D. The construction element according to any one of the preceding elements, wherein the data signals are transmitted via the electrically conducting front layer and/or the electrically conducting rear layer by means of Direct Current Power Line Communication.

E. The construction element according to any one of the preceding elements, further comprising a third conducting layer, preferably positioned between the electrically conducting front layer and the electrically conducting rear layer, where the third conducting layer is adapted to transmit the data signals.

F. The construction element according to any one of the preceding elements, where the electronic component is a light emitting diode, LED, preferably a Surface Mount Diode, SMD.

G. The construction element according to element F, where the controller is adapted to control one or more of color of emitted light, color combination of emitted light from two or more light emitters, invisible light frequency and/or light intensity.

H. The construction element according to any one of the preceding elements, where the construction element comprises at least a first and a second electronic component, the first electronic component being connected to a first controller and the second electronic component being connected to a second controller, wherein the first controller is adapted to receive data from the second controller and the second controller is adapted to send data to the first controller.

I. The construction element according to any one of the preceding elements, where the construction element further comprises a light processing layer covering a recess provided in the sandwich structure in which the electronic component is provided, preferably a watertight polymer panel or film, such as an opallized acrylic panel/film, a clear acrylic panel/film, an acrylic prismatic panel/film, a transparent or semitransparent colored panel/film, a lens and/or an acrylic lens panel.

J. The construction element according to any one of the preceding elements, wherein the electronic component is positioned in a recess in the construction element, the construction element comprising:
a conducting retainer element positioned at least partly inside the recess along the circumference of the recess in contact with the electrically conducting front layer, and/or
a conducting element, preferably resilient, such as a wave spring, positioned in press between the conducting retainer element and the circuit board such that an electrical connection is established between the electrically conducting front layer and the circuit board.

K. The construction element according to J, wherein the conducting element is provided with one or more conducting legs providing a connection between a base of the conducting element and the conducting retainer element.

L. The construction element according to K, wherein the one or more conducting legs has/have a proximal end facing the base of the conducting element and a distal end facing the conducting retainer element, wherein the interface between the distal end and the conducting retainer element is provided with a nickel or silver coating.

M. The construction element according to any one of the preceding elements, wherein the circuit board is made of metal, preferably aluminum or an aluminum alloy.

N. The construction element according to any one of the preceding elements, wherein the circuit board has a front side which faces the electronic component and a back side which faces the electrically conducting rear layer, wherein at least a part of the back side is provided with a gold or silver coating.

O. The construction element according to any one of the preceding elements, wherein the circuit board is a printed circuit board.

P. The construction element according to any one of the preceding elements, wherein a pre-resistor is connected in series with the electronic component.

Q. The construction element according to element O, wherein the pre-resistor is positioned between the electronic component and one of the electrically conducting front layer and the electrically conducting rear layer.

R. The construction element according to element B and P, wherein the pre-resistor is positioned between one of the electrically conducting front layer and the electrically conducting rear layer and the controller.

S. The construction element according to element J or K, wherein the retainer element is made of aluminum.

T. The construction element according to element J or K, wherein the retainer element comprises polymer and spring steel.

U. The construction element according to element J or K, wherein an outer side of the retainer element adapted for engagement with the electrically insulating layer is corrugated.

V. The construction element according to any one of the preceding elements, wherein the electronic component is adapted to be turned 180 degrees in a plane parallel to any of the conducting front or rear layers.

X. Method of transmitting data to an electronic component comprised by a construction element comprising the steps of:
providing a sandwich structure comprising an electrically insulating layer and at least two electrically conducting layers, which comprises an electrically conducting front layer and an electrically conducting rear layer which are spaced apart by an electrically insulating layer,
providing a circuit board between an electronic component and the electrically conducting rear layer,
positioning the electronic component on the circuit board,
providing the electronic component with a first and a second electrical terminal,
connecting the first electrical terminal with the electrically conducting front layer, and
connecting the second electrical terminal with the electrically conducting rear layer.

Y. Method according to element X, further comprising providing a controller, and communicating data signals to and/or from the controller via at least one of the electrically conducting layers.

The invention claimed is:
1. A construction element comprising:
a sandwich structure comprising an electrically insulating layer and at least two electrically conducting layers, which comprises an electrically conducting front layer and an electrically conducting rear layer which are spaced apart by the electrically insulating layer,
a circuit board carrying an electronic component and being positioned between the electronic component and the electrically conducting rear layer, wherein the electronic component is positioned in a recess in the construction element,
a conducting retainer element positioned at least partly inside the recess along the circumference of the recess in contact with the electrically conducting front layer,
a resilient conducting element positioned in press between the conducting retainer element and the circuit board such that an electrical connection is established between the electrically conducting front layer and the circuit board and such that the resilient conducting element keeps the circuit board in place, the electronic component being a light emitting diode (LED) comprising a first and a second electrical terminal, wherein the first electrical terminal is in electrical connection with the electrically conducting front layer, and the second electrical terminal is in electrical connection with the electrically conducting rear layer, and a controller adapted for communication of data signals via at least one of the electrically conducting layers.

2. The construction element according to claim 1, wherein the resilient conducting element is a wave spring, a spring washer, a disc spring or a coil spring.

3. The construction element according to claim 1, wherein the construction element is a construction panel.

4. The construction element according to claim 1, further comprising a third conducting layer, wherein the third conducting layer is adapted to transmit the data signals.

5. The construction element according to claim 4, wherein the third conducting layer is positioned between the electrically conducting front layer and the electrically conducting rear layer.

6. The construction element according to claim 1, wherein the LED is a Surface Mount Diode (SMD).

7. The construction element according to claim 6, wherein the controller is adapted to control one or more parameters selected from the group consisting of color of emitted light, color combination of emitted light from two or more light emitters, invisible light frequency and/or light intensity.

8. The construction element according to claim 1, wherein the construction element comprises at least a first and a second electronic component, the first electronic component being connected to a first controller and the second electronic component being connected to a second controller, wherein the first controller is adapted to receive data from the second controller and the second controller is adapted to send data to the first controller.

9. The construction element according to claim 1, wherein the construction element further comprises a light processing layer on top of the electrically conducting front layer.

10. The construction element according to claim 9, wherein the light processing layer is selected from the group consisting of a watertight polymer panel or film, such as an opallized acrylic panel/film, a clear acrylic panel/film, an acrylic prismatic panel/film, a transparent or semitransparent colored panel/film, and/or an acrylic lens panel.

11. A construction element comprising:
a sandwich structure comprising an electrically insulating layer and at least two electrically conducting layers, which comprises an electrically conducting front layer and an electrically conducting rear layer which are spaced apart by the electrically insulating layer,
a circuit board carrying an electronic component and being positioned between the electronic component and the electrically conducting rear layer, where the electronic component is positioned in a recess in the construction element,
a resilient conducting element positioned in press between a conducting retainer element and the circuit board such that an electrical connection is established between the electrically conducting front layer and the circuit board and such that the resilient conducting element keeps the circuit board in place,
the electronic component being a light emitting diode (LED) comprising a first and a second electrical terminal, wherein the first electrical terminal is in electrical connection with the electrically conducting front layer, and the second electrical terminal is in electrical connection with the electrically conducting rear layer, and a controller adapted for communication of data signals via at least one of the electrically conducting layers.

12. The construction element according to claim 11, wherein the resilient conducting element is a wave spring, a spring washer, a disc spring or a coil spring.

13. The construction element according to claim 11, wherein the construction element is a construction panel.

14. The construction element according to claim 11, further comprising a third conducting layer, wherein the third conducting layer is adapted to transmit the data signals.

15. The construction element according to claim 14, wherein the third conducting layer is positioned between the electrically conducting front layer and the electrically conducting rear layer.

16. The construction element according to claim 11, wherein the LED is a Surface Mount Diode (SMD).

17. The construction element according to claim 16, wherein the controller is adapted to control one or more parameters selected from the group consisting of color of emitted light, color combination of emitted light from two or more light emitters, invisible light frequency and/or light intensity.

18. The construction element according to claim 11, wherein the construction element comprises at least a first and a second electronic component, the first electronic component being connected to a first controller and the second electronic component being connected to a second controller, wherein the first controller is adapted to receive data from the second controller and the second controller is adapted to send data to the first controller.

19. The construction element according to claim 11, wherein the construction element further comprises a light processing layer on top of the electrically conducting front layer.

20. The construction element according to claim 19, wherein the light processing layer is selected from the group consisting of a watertight polymer panel or film, such as an opallized acrylic panel/film, a clear acrylic panel/film, an acrylic prismatic panel/film, a transparent or semitransparent colored panel/film, and/or an acrylic lens panel.

21. Method of transmitting data to an electronic component comprised by a construction element comprising
a sandwich structure comprising an electrically insulating layer and at least two electrically conducting layers, which comprises an electrically conducting front layer and an electrically conducting rear layer which are spaced apart by the electrically insulating layer,
a circuit board carrying an electronic component and being positioned between the electronic component and the electrically conducting rear layer, the electronic component being positioned in a recess in the construction element,
a resilient conducting element positioned in press between a conducting retainer element and the circuit board such that an electrical connection is established between the electrically conducting front layer and the circuit board and such that the resilient conducting element keeps the circuit board in place,
the electronic component being a light emitting diode (LED) comprising a first and a second electrical terminal, wherein the first electrical terminal is in electrical connection with the electrically conducting front layer, and the second electrical terminal is in electrical connection with the electrically conducting rear layer, and a controller adapted for communication of data signals via at least one of the electrically conducting layers, the method comprising the steps of providing the construction element, and communicating data signals to and/or from the controller via at least one of the electrically conducting layers.

22. The method according to claim 21, wherein the data signals are transmitted by means of Direct Current Power Line Communication.

* * * * *